US012400690B2

(12) United States Patent
Khera et al.

(10) Patent No.: US 12,400,690 B2
(45) Date of Patent: Aug. 26, 2025

(54) GLOBAL BOOSTING CIRCUIT

(71) Applicant: Taiwan Semiconductor Manufacturing Company, Ltd., Hsinchu (TW)

(72) Inventors: Ishan Khera, Hsinchu (TW); Atul Katoch, Kanata (CA)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 162 days.

(21) Appl. No.: 18/351,629

(22) Filed: Jul. 13, 2023

(65) Prior Publication Data

US 2024/0055032 A1    Feb. 15, 2024

Related U.S. Application Data

(60) Provisional application No. 63/384,621, filed on Nov. 22, 2022, provisional application No. 63/396,650, filed on Aug. 10, 2022.

(51) Int. Cl.
 *G11C 7/10* (2006.01)
 *G11C 7/08* (2006.01)
 *G11C 7/12* (2006.01)

(52) U.S. Cl.
 CPC .............. *G11C 7/1048* (2013.01); *G11C 7/08* (2013.01); *G11C 7/12* (2013.01)

(58) Field of Classification Search
 CPC ............ G11C 7/12; G11C 7/08; G11C 7/1048
 USPC ....................................................... 365/203
 See application file for complete search history.

(56) References Cited

U.S. PATENT DOCUMENTS

| 5,982,692 A | 11/1999 | Lattimore et al. |
| 7,312,503 B2 | 12/2007 | Umezawa et al. |
| 8,811,088 B2 | 8/2014 | Joo et al. |
| 9,019,752 B1* | 4/2015 | Puckett ................. G11C 11/419 365/191 |

(Continued)

FOREIGN PATENT DOCUMENTS

| KR | 20130034763 A | 4/2013 |
| KR | 20200002647 A | 1/2020 |

(Continued)

OTHER PUBLICATIONS

Taiwan Office Action; Application No. 112129860; Dated Jul. 10, 2024.

(Continued)

*Primary Examiner* — Sung Il Cho
(74) *Attorney, Agent, or Firm* — Jones Day (57) ABSTRACT

Systems and methods are provided for a memory device including a first memory array, a local input/output (LIO) circuit, and a global input/output (GIO) circuit. The first memory array includes a memory cell and a local bit line. The LIO circuit is configured to receive a local bit line signal on the local bit line and to generate a global bit line signal on a global bit line based on the local bit line signal. The GIO circuit is coupled to the LIO circuit and is configured to receive the global bit line signal. The GIO circuit comprises a latch circuit including a global bit line signal latch that is configured to latch the global bit line signal, and a booster circuit that is configured to drive the global bit line signal in the GIO circuit based on a previous global bit line signal.

20 Claims, 5 Drawing Sheets

(56) References Cited

U.S. PATENT DOCUMENTS

| | | | |
|---|---|---|---|
| 9,972,366 B2 | 5/2018 | Kang | |
| 10,783,938 B2 | 9/2020 | Katoch et al. | |
| 2009/0003029 A1* | 1/2009 | Kato | G11C 7/1048 365/189.011 |
| 2011/0317478 A1* | 12/2011 | Chan | G11C 29/1201 365/156 |
| 2012/0250442 A1* | 10/2012 | Roy | G11C 11/4091 365/203 |
| 2013/0083607 A1 | 4/2013 | Joo et al. | |
| 2015/0078086 A1 | 3/2015 | Lee | |
| 2016/0027503 A1 | 1/2016 | Anvar et al. | |
| 2017/0148499 A1* | 5/2017 | Matsui | G11C 11/4097 |
| 2018/0061486 A1* | 3/2018 | Itoh | G11C 11/417 |
| 2018/0276151 A1 | 9/2018 | Lea | |
| 2019/0103155 A1* | 4/2019 | Cosemans | G11C 7/065 |
| 2020/0005837 A1 | 1/2020 | Katoch et al. | |
| 2022/0068360 A1* | 3/2022 | Pallerla | G11C 7/1075 |

FOREIGN PATENT DOCUMENTS

| | | |
|---|---|---|
| TW | I734130 | 7/2021 |
| TW | I745404 | 11/2021 |

OTHER PUBLICATIONS

Taiwan Notice of Allowance; Application No. 112129860; Dated Feb. 7, 2025.
Korean Office Action; Application No. 10-2023-0102416; Dated Aug. 12, 2024.
German Office Action; Application No. 10 2023 119 292.2; Dated Jun. 24, 2025.

\* cited by examiner

GLOBAL BOOSTING CIRCUIT

CROSS-REFERENCE TO RELATED APPLICATIONS

This application claims priority to U.S. Provisional Application No. 63/396,650, filed Aug. 10, 2022, entitled "Semiconductor Device and Method of Operating the Same," and U.S. Provisional Application No. 63/384,621, filed Nov. 22, 2022, entitled "Global Boosting Circuit for Read Global Bitline for Multi Bank Memories," both of which are incorporated herein by reference in their entireties.

FIELD

The present disclosure relates to memory devices and in particular to multibank memories.

BACKGROUND

Memory devices are electronic data storage devices that include memory banks that include memory locations for storage of data. Devices that include multiple memory banks may experience timing issues related to signals within those devices. Example memory banks may comprise a local input/output (LIO) circuit and one or more memory arrays. The memory bank may be coupled to a global input/output (GIO) circuit that generates a global input/output signal. For example, some memory devices include a plurality of memory banks. In such memory devices, the distance between the LIO circuits and the GIO circuit increases. This can lead to a greater time delay from generating signals (e.g., a global bit line signal) in the LIO circuit and receiving them in the GIO circuit. Furthermore, the greater time delay can require charging the signals in the LIO circuit for a significant amount of time to ensure the signals are latched in the GIO circuit. Therefore, there is a need in the art to mitigate or eliminate the dependency of latching the signals in the GIO circuit on charging the signals in the LIO circuit.

BRIEF DESCRIPTION OF THE DRAWINGS

The following detailed description will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity and are not intended to limit the scope of the invention or the appended claims. Further, it should be understood that any one of the features can be used separately or in combination with other features. Other systems, methods, features, and advantages of the invention will be or become apparent to one with skill in the art upon examination of the detailed description. It is intended that all such additional systems, methods, features, and advantages be included within this description, be within the scope of the present invention, and be protected by the accompanying claims.

Example memory devices include one or more memory banks comprising a local input/output (LIO) circuit and one or more memory arrays. A memory bank may be coupled to a global input/output (GIO) circuit that generates a global input/output signal. Some memory devices include a plurality of memory banks. In such memory devices, the distance between the LIO circuits and the GIO circuit increases. This can lead to a greater time delay from generating signals (e.g., a global bit line signal) in the LIO circuit and receiving them in the GIO circuit. Furthermore, the greater time delay can require charging the signals in the LIO circuit for a significant amount of time to ensure the signals are latched in the GIO circuit. This can delay the charging of the signals for a later clock cycle and can increase the time to access data from the memory device. Therefore, a memory circuit may benefit from mitigation or elimination of any dependency of latching the signals in the GIO circuit on charging the signals in the LIO circuit.

In embodiments, it may be desirable to use components and circuits within the GIO circuit to drive the signals generated in the LIO circuit to assist in latching the signals in the GIO circuit. Embodiments disclosed herein involve using circuits in the GIO circuit to drive the signals generated in the LIO circuit. Examples and embodiments disclosed herein can reduce the access time of generated data and reduce or eliminate the dependency of latching the signals generated in the LIO circuit on charging the signals by components within the LIO circuit.

Figure 1:
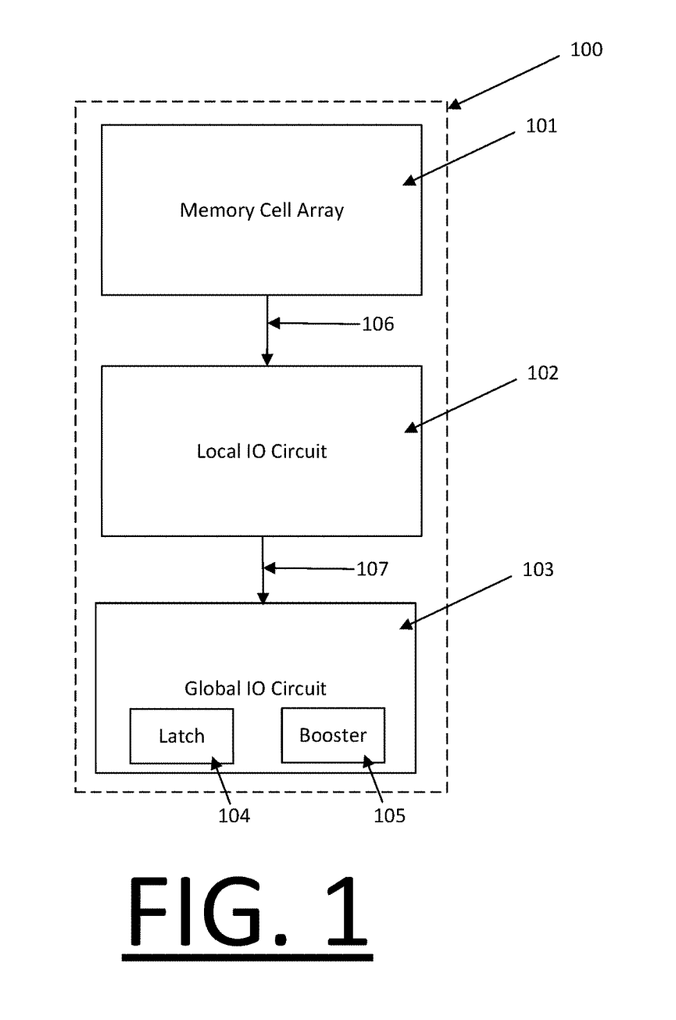
FIG. 1 depicts a block diagram of an example memory device, in accordance with some embodiments.

FIG. 1 depicts a block diagram of an example memory device 100, in accordance with some embodiments. The memory device 100 includes a memory cell array 101, a local input/output (LIO) circuit 102, and a global input/output (GIO) circuit 103. The memory cell array 101, which is an SRAM memory array in some examples, generates data signals 106 that are received by the LIO circuit 102. The memory cells may include a plurality of transistors (e.g., a 4T, 6T, 8T, or 10T memory cell). The LIO circuit 102 receives the data signals 106 and generates a global bit line signal 107 on a global bit line. The GIO circuit 103 receives the global bit line signal 107. The GIO circuit 103 includes a latch circuit 104 that latches the global bit line signal 107 in the GIO circuit 103. The GIO circuit 103 further includes a booster circuit 105 configured to drive the global bit line signal 107 in the GIO circuit 103 based on a previous global bit line signal 107 from a previous clock cycle. In embodiments of the present disclosure, the booster circuit 105 and the latch circuit 104 within the GIO circuit 103 can reduce the access time of data generated within the memory device 100, as compared with conventional memory devices. Furthermore, the booster circuit 105 and latch circuit 104 can reduce or eliminate the dependency of latching the signals generated in the LIO circuit 102 on charging the signals by components within the LIO circuit 102.

Figure 2:
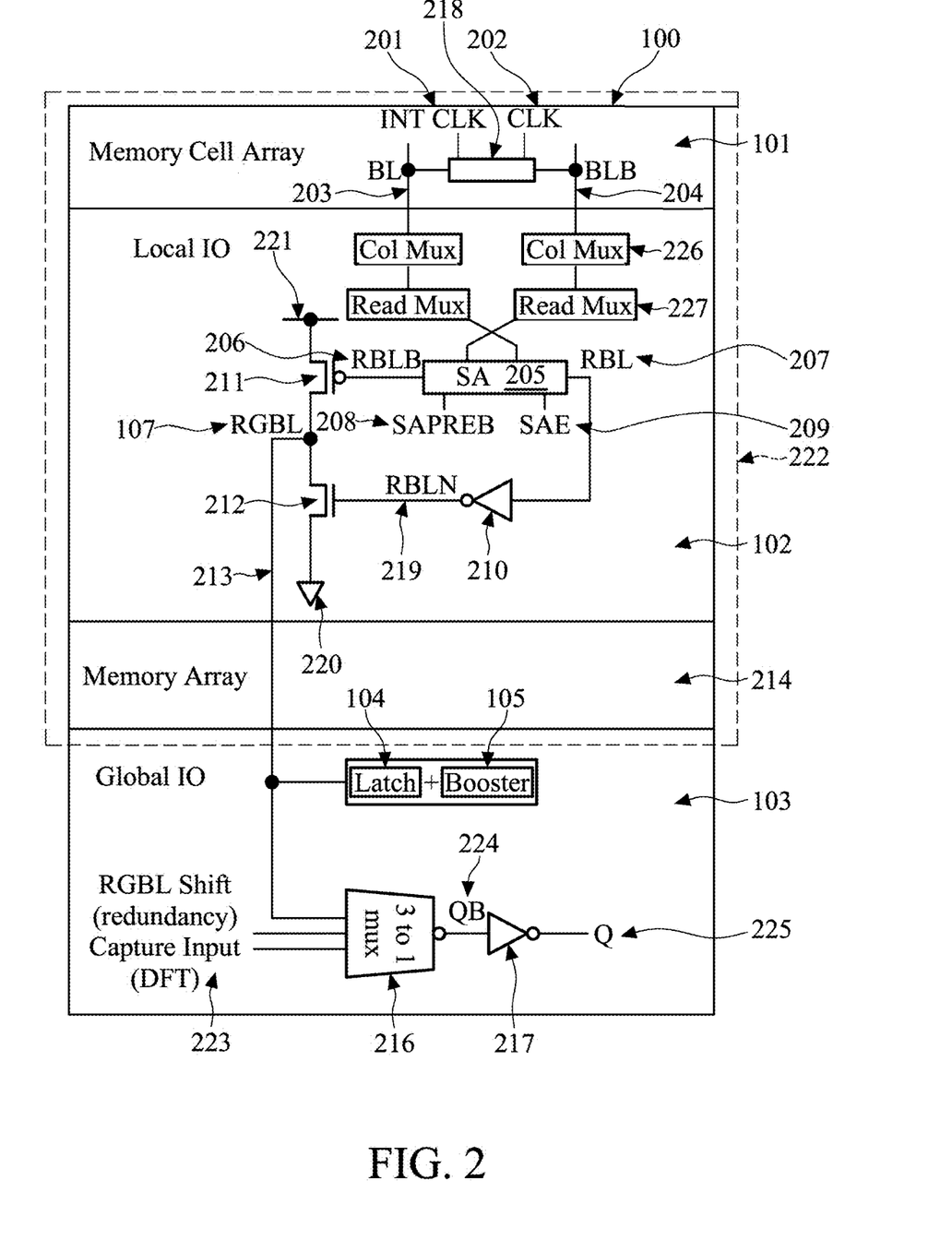
FIG. 2 depicts further aspects of the example memory device, in accordance with some embodiments.

FIG. 2 depicts further aspects of the example memory device, in accordance with some embodiments. In the example embodiment depicted in FIG. 2, the memory cell array 101 of the memory device 100 includes a plurality of memory cells 218. The plurality of memory cells 218 forms a column of memory cells. The column of memory cells are connected to the LIO circuit 102 by a bit line 203 and a complimentary bit line 204. The bit line 203 receives a bit line signal from the plurality of memory cells 218. The complimentary bit line 204 receives a complimentary bit line signal from the plurality of memory cells 218. The complimentary bit line 204 and the bit line 203 include one or more column multiplexers 226 and read multiplexers 227, which can be used to read bit data from a plurality of the memory cells 218 onto the bit line 203 and the complimentary bit line 204. The LIO circuit 102 includes a sense amplifier 205. The bit line 203 and complimentary bit line 204 are coupled to the sense amplifier 205. The sense amplifier 205 receives the bit line signal, the complimentary bit line signal, a sense amplifier enable signal SAE 209, and a sense amplifier pre-charge signal SAPREB 208.

The sense amplifier 205 is configured to generate a read bit line signal RBL 207 on a read bit line terminal and a read bit line bar signal RBLB 206 on a read bit line bar terminal based on the received bit line signal, complimentary bit line signal, and sense amplifier enable signal SAE 209. For example, prior to a read operation, the sense amplifier pre-charge signal SAPREB 208 is enabled and charges the read bit line bar signal RBLB 206 and read bit line signal RBL 207 to a logic high (e.g., "1"). The sense amplifier 205 compares the voltage levels of the bit line 203 and the complimentary bit line 204 and reads bit data from a memory cell within the plurality of memory cells 218 based on the difference in voltage levels of the bit line 203 and the complimentary bit line 204. For example, if the bit data in the memory cell is a logic high, the sense amplifier 205 may read a logic high based on the voltages of the bit line 203 and complimentary bit line 204 to which the memory cell is coupled.

During a read operation, the sense amplifier enable signal SAE 209 is enabled to logic high. Based on the sense amplifier enable signal SAE 209, the sense amplifier 205 amplifies the bit data from the bit line 203 and the complimentary bit line 204 to sufficient readable logic levels (e.g., logic high or "1"). The sense amplifier 205 generates the read bit line signal RBL 207 and the read bit line bar signal RBLB 206 based on the amplified bit data. For example, if the sense amplifier 205 reads a logic high signal based on the difference in voltage levels of the bit line 203 and the complimentary bit line 204, the sense amplifier 205 may output a read bit line signal RBL 207 that is at logic high and a read bit line bar signal RBLB 206 that is at logic low.

The read bit line signal RBL 207 is received by the inverter 210, which outputs a read bit line NOT (RBLN) signal 219 that is the inverse of the read bit line signal RBL 207. The RBLN signal 219 is received by the gate terminal of an NMOS transistor 212. The NMOS transistor 212 is a pull-down transistor, which selectively pulls the read global bit line signal 107 to a VSS voltage level 220 (e.g., logic low) based on receiving a logic high RBLN signal 219 at its terminal. For example, if the read bit line signal RBL 207 is logic low, then the inverter 210 will output a logic high RBLN signal 219 and the NMOS transistor 212 will pull the read global bit line signal RGBL 107 to a VSS voltage level 220. The read bit line bar signal RBLB 206 is received at a PMOS transistor 211 that is coupled to the NMOS transistor 212. The read global bit line signal RGBL 107 is generated on a global bit line 213 that is coupled to a junction of the PMOS transistor 211 and the NMOS transistor 212. The PMOS transistor 211 will selectively pull the global bit line signal RGBL 107 to a VDD voltage level 221 (e.g., logic high) based on receiving a logic low read bit line bar RBLB signal 206.

As shown in FIG. 2, the global bit line 213 may pass through another memory array 214 including a second plurality of memory cells (not shown). The memory arrays and the LIO circuit 102 form a memory bank 222. In a multi-bank memory device, the memory device 100 includes a plurality of memory banks 222. For example, a plurality of memory banks 222 may be coupled to one another in a horizontal direction (e.g., a direction perpendicular to the global bit line 213) and may form a memory row. Furthermore, a multi-bank memory may include a plurality of memory rows coupled to one another in a direction parallel to the global bit line 213.

The GIO circuit 103 is coupled to the memory bank 222 and the global bit line 213. The GIO circuit 103 receives the global bit line signal RGBL 107 on the global bit line 213. In the example embodiment depicted in FIG. 2, the GIO circuit 103 includes a multiplexer 216. The multiplexer 216 receives the global bit line signal RGBL 107 and one or more redundant global bit line signals 223. The redundant global bit line signals 223 include the same data as the global bit line 213 and are used to maintain the global bit line signal RGBL 107 if it becomes decoupled from the multiplexer 216. For example, if the multiplexer 216 fails to read the global bit line signal RGBL 107, the multiplexer 216 selects from a redundant global bit line signal 223 to maintain operation of the GIO circuit 103 and memory device 100. The multiplexer 216 generates a global IO bar signal QB 224 based on the received global bit line signal RGBL 107 and redundant global bit line signals 223. The global IO bar signal QB 224 is received at an inverter 217, which outputs a global IO signal Q 225. The GIO circuit 103 further includes a latch circuit 104 and a booster circuit 105 coupled to the global bit line 213. The latch circuit 104 and the booster circuit 105 are discussed further with reference to FIG. 3.

Figure 3:
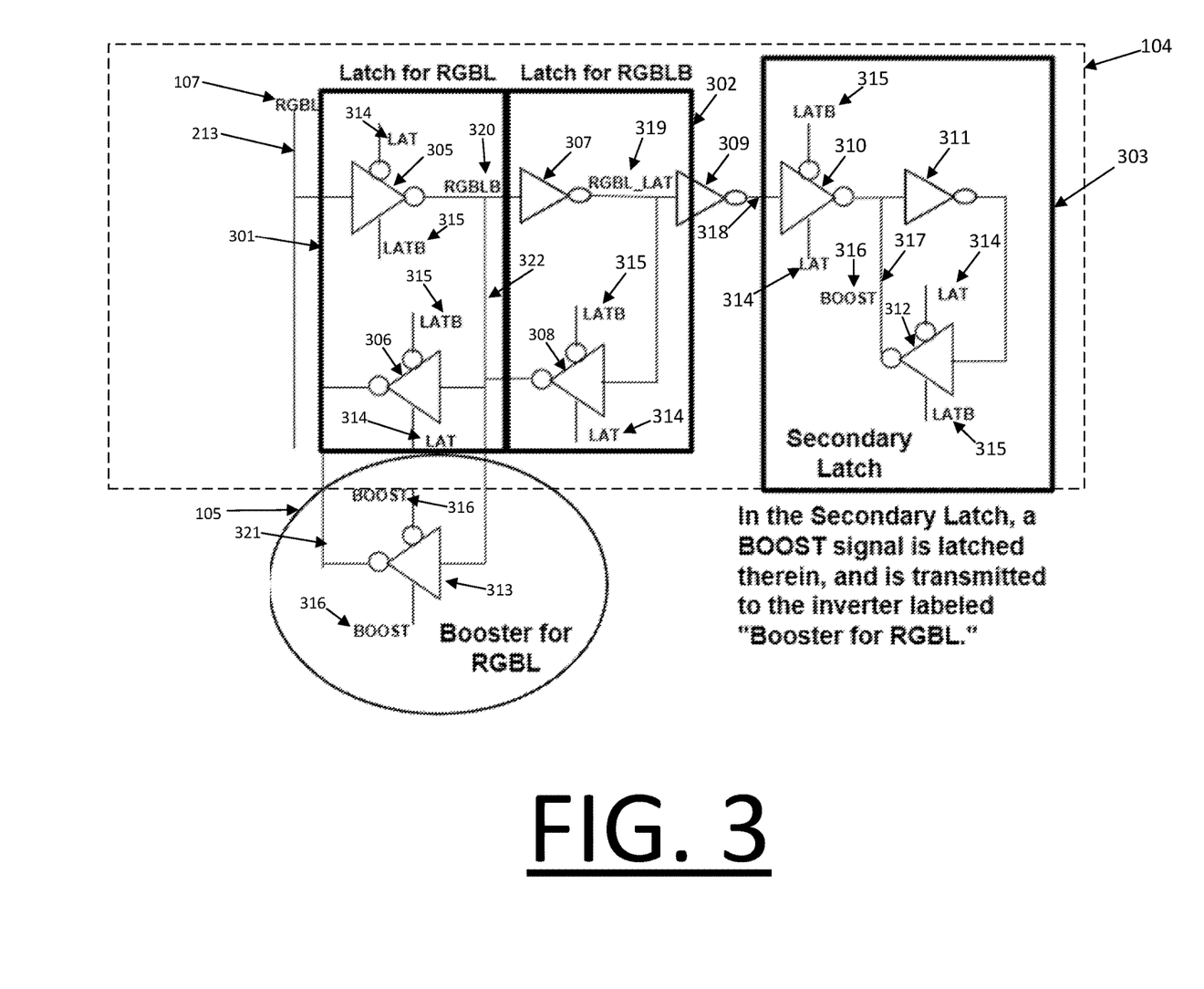
FIG. 3 depicts a latch circuit and booster circuit, in accordance with some embodiments.

FIG. 3 depicts a latch circuit 104 and booster circuit 105, in accordance with some embodiments. As shown in FIG. 3, the latch circuit 104 and booster circuit 105 are coupled to the global bit line 213. The latch circuit 104 includes a global bit line signal latch 301, a global bit line bar signal latch 302, and a secondary latch 303. A booster circuit 105 is coupled to the latch circuit 104. The global bit line signal latch 301 is configured to latch (e.g., store) the global bit line signal RGBL 107. The global bit line bar signal latch 302 is configured to latch a global bit line bar signal RGBLB 320 (e.g., an inverse of the global bit line signal RGBL 107). The secondary latch 303 is configured to latch a boost signal 316, which can be used to maintain the global bit line signal RGBL 107 in the GIO circuit 103 based on a previous global bit line signal RGBL 107 from a previous clock cycle (e.g., previous clock period of clock signal CLK 202). The secondary latch 303 transfers the boost signal 316 to the booster circuit 105, which is coupled to the global bit line 213.

The global bit line signal latch 301 includes a first inverter 305 and a second inverter 306. The input of the first inverter 305 of the global bit line signal latch 301 is coupled to the global bit line 213 and receives the global bit line signal 107. The first inverter 305 of the global bit line signal latch 301 includes a first enable terminal receiving a latch enable signal LAT 314 and a second enable terminal receiving a latch enable bar signal LATB 315 (e.g., an inverse of the latch enable signal LAT 314). The latch enable signal LAT 314 and the latch enable bar signal LATB 315 may be generated from a global control block (not shown). The global control block may be located externally from the GIO circuit 103 or within the GIO circuit 103. The output of the first inverter 305 is coupled to a complimentary global bit line 322. The second inverter 306 of the global bit line signal latch 301 is coupled to the first inverter 305 of the global bit line signal latch 301. The second inverter 306 includes a first enable terminal receiving the latch enable bar signal LATB 315 and a second enable terminal receiving the latch enable signal LAT 314. The input of the second inverter 306 is coupled to the output of the first inverter 305. The output of the second inverter 306 is coupled to the global bit line 213.

The global bit line bar signal latch 302 includes a first inverter 307 and a second inverter 308. The input of the first inverter 307 of the global bit line bar signal latch 302 is coupled to the complimentary global bit line 322 and the output of the first inverter 305 of the global bit line signal latch 301. The second inverter 308 of the global bit line bar signal latch 302 is coupled to the first inverter 307 of the global bit line bar signal latch 302. The second inverter 308 of the global bit line bar signal latch 302 includes a first enable terminal receiving the latch enable bar signal LATB 315 and a second enable terminal receiving the latch enable signal LAT 314. The input of the second inverter 308 receives the output of the first inverter 307. The output of the second inverter 308 of the global bit line bar signal latch 302 is coupled to the complimentary global bit line 322, the input of the second inverter 306 of the global bit line signal latch 301, and the input of the first inverter 307 of the global bit line bar signal latch 302.

The latch circuit 104 further includes a secondary latch input inverter 309. The secondary latch input inverter 309 is coupled to the global bit line bar signal latch 302 and receives the output of the first inverter 307 of the global bit line bar signal latch 302. The output of the secondary latch input inverter 309 is received at a first inverter 310 of the secondary latch 303. The first inverter 310 of the secondary latch 303 includes a first enable terminal that receives the latch enable bar signal LATB 315. The first inverter 310 of the secondary latch 303 further includes a second enable terminal that receives the latch enable signal LAT 314. The output of the first inverter 310 is coupled to an input of a second inverter 311 of the secondary latch 303. The second inverter 311 receives the output of the first inverter 310 and generates an output that is an inverse of the output of the first inverter 310. The output of the second inverter 311 of the secondary latch 303 is received by a third inverter 312 of the secondary latch 303.

The third inverter 312 of the secondary latch 303 includes a first enable terminal receiving the latch enable signal LAT 314 and a second enable terminal receiving the latch enable bar signal LATB 315. The third inverter 312 of the secondary latch 303 generates a boost signal 316. The boost signal 316 is stored at a booster node 317 coupled to the output of the third inverter 312 of the secondary latch 303 and the input of the second inverter 311 of the secondary latch 303. The boost signal 316 is used to drive the global bit line signal RGBL 107 based on a previous global bit line signal RGBL 107 from a previous clock cycle, as described further below.

The booster circuit 105 is coupled to the global bit line signal latch 301. The GIO circuit 103 may further include a second booster circuit (not shown) that is coupled to the global bit line bar signal latch 302. The second booster circuit may function similarly to the booster circuit 105 and may drive the global bit line bar signal RGBLB 320 based on a previous global bit line bar signal RGBLB 320 from a previous clock cycle. The booster circuit 105 includes a booster inverter 313. The input of the booster inverter 313 is coupled to the output of the first inverter 305 of the global bit line signal latch 301. The input of the booster inverter 313 is also coupled to the input of the second inverter 306 of the global bit line signal latch 301. The output of the booster inverter 313 is coupled to the output of the second inverter 306 of the global bit line signal latch 301, the input of the first inverter 305 of the global bit line signal latch 301, and the global bit line 213. The booster inverter 313 includes a first enable terminal and a second enable terminal. The first enable terminal and the second enable terminal are coupled to the booster node 317. The first enable terminal and the second enable terminal each receive the boost signal 316 from the booster node 317.

Figure 4:
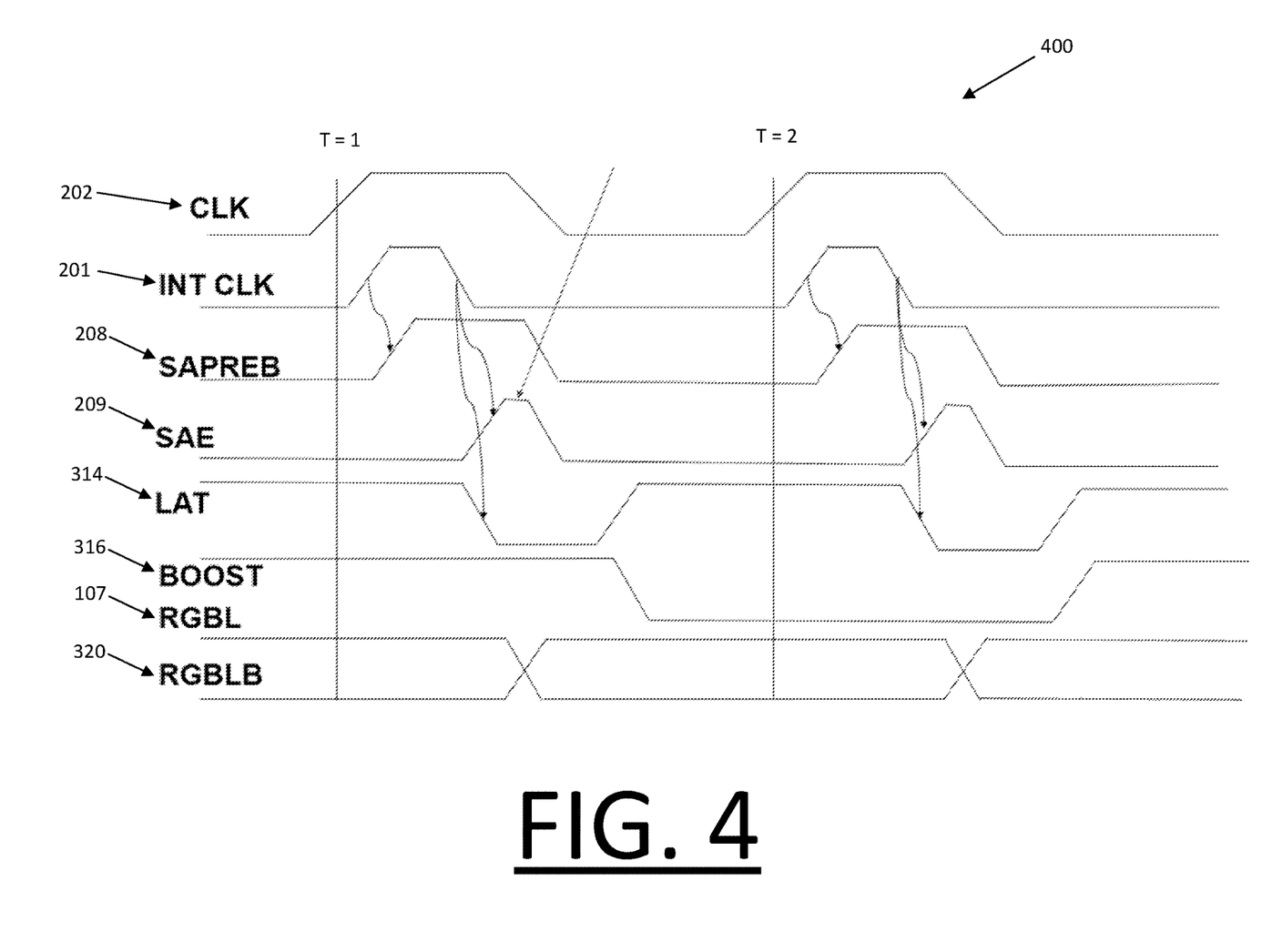
FIG. 4 depicts a timing diagram of a read operation of a global bit line, in accordance with some embodiments.

FIG. 4 depicts a timing diagram of a read operation of a global bit line, in accordance with some embodiments. The description of the read operation may be best understood when read with reference to FIGS. 2, 3, and 4. At time T=1, bit data containing a logic level of "0" is read from a memory cell 218. At time t=1, the read global bit line signal RGBL 107 is at logic high ("1") and the boost signal BOOST 316 is also at logic high ("1"). At the start of a clock cycle, the clock signal CLK 202 may transition from logic low ("0") to logic high ("1"). The clock signal CLK 202 may alternate between logic low ("0") and logic high ("1"), for example, based on oscillations of an oscillator (e.g., a quartz crystal) within the memory device 100. Based on the transition of the clock signal CLK 202 from logic low ("0") to logic high ("1"), the internal clock signal INT CLK 201 may also transition from logic low ("0") to logic high ("1"). The internal clock signal INT CLK 201 may be based on the oscillation of, for example, an RC oscillator within the memory device 100. The internal clock signal INT CLK 201 is generated in the control block of the memory device 100. Based on the rising edge (e.g., the transition from logic low to logic high) of the internal clock signal INT CLK 201, the sense amplifier pre-charge signal SAPREB 208 may transition from logic low ("0") to logic high ("1"). For example, the control block of the memory device 100 transitions the sense amplifier pre-charge signal SAPREB 208 from logic low ("0") to logic high ("1") based on the control block detecting the rising edge of the internal clock signal INT CLK 201. The sense amplifier pre-charge signal SAPREB 208 charges both the read bit line signal RBL 207 and the read bit line bar signal RBLB 206 to logic high ("1"). The internal clock signal INT CLK 201 may then transition from logic high ("1") to logic low ("0") based on the oscillation of the RC oscillator within the memory device 100.

Based on the falling edge (e.g., the transition from logic high to logic low) of the internal clock signal INT CLK 201, the sense amplifier enable signal SAE 209 transitions from logic low to logic high. As discussed above, the falling edge of the internal clock signal INT CLK 201 can be based on the oscillations of an oscillator within the memory device 100. The control block may sense the falling edge of the internal clock signal INT CLK 201 and switch the sense amplifier enable signal SAE 209 from logic low to logic high. Furthermore, based on the falling edge of the internal clock signal INT CLK 201, the latch enable signal LAT 314 transitions from logic high to logic low. For example, the control block in the memory device 100 senses the falling edge of the internal clock signal INT CLK 201 and switches the latch enable signal LAT 314 from logic high to logic low. Based on the logic high sense amplifier enable signal SAE 209, the read bit line signal RBL 207 transitions from logic high ("1") to logic low ("0"). For example, the sense amplifier enable signal SAE 209 drives the read bit line signal RBL 207 to a logic level of "0" based on the logic low bit data read from the memory cell 218. Furthermore, the read bit line bar signal RBLB 206 remains at logic high ("1"). As discussed above with reference to FIG. 2, the inverter 210 of the LIO circuit 102 generates a logic high RBLN signal 219 based on the logic low read bit line signal RBL 207. The logic high RBLN signal 219 is received at the NMOS transistor 212 and couples the global bit line 213 to the VSS voltage level 220, and the global bit line signal RGBL 107 transitions from logic high to logic low.

As shown in FIG. 3, the global bit line signal RGBL 107 is received at the first inverter 305 of the global bit line signal latch 301. The first inverter 305 is enabled by the logic low latch enable signal LAT 314 received at its first enable terminal and the logic high latch enable bar signal LATB 315 received at its second enable terminal. Therefore, the first inverter 305 generates a logic high global bit line bar signal RGBLB 320, and the global bit line bar signal RGBLB 320 transitions from logic low to logic high. The second inverter 306 of the global bit line signal latch 301 is disabled based on the logic high latch enable bar signal LATB 315 received at its first enable terminal and the logic low latch enable signal LAT 314 received at its second enable terminal.

The first inverter 307 of the global bit line bar signal latch 302 receives the logic high global bit line bar signal RGBLB 320 and generates a logic low global bit line latch signal RGBL_LAT 319. The second inverter 308 of the global bit line bar signal latch 302 is disabled based on the logic high latch enable bar signal LATB 315 received at its first enable terminal and the logic low latch enable signal LAT 314 received at its second enable terminal. Thus, the global bit line bar signal RGBLB 320 is maintained at logic high. The secondary latch input inverter 309 receives the logic low global bit line latch signal RGBL_LAT 319 and generates a logic high secondary latch input signal 318. The logic high secondary latch input signal 318 is received by the first inverter 310 of the secondary latch 303. The first inverter 310 of the secondary latch 303 is disabled based on the logic high latch enable bar signal LATB 315 received its first enable terminal and the logic low latch enable signal LAT 314 received at its second enable terminal. Therefore, the boost signal 316 at the booster node 317 is maintained at logic high from the previous clock cycle.

As discussed above, the booster node 317 is coupled to the first enable terminal and the second enable terminal of the booster inverter 313 of the booster circuit 105. The booster inverter 313 is enabled based on the boost signal 316 received at its first and second enable terminals. Thus the logic high global bit line bar signal RGBLB 320 is received at the input of the booster inverter 313 and the booster inverter 313 outputs a logic low booster inverter output signal 321. As discussed above, the output of the booster inverter 313 is coupled to the global bit line 213. The logic low booster inverter output signal 321 and the boost signal 316 can thus drive the global bit line 213 and latch the global bit line signal RGBL 107 based on the previously read data stored in the secondary latch 303 (e.g., the boost signal). When the latch enable signal LAT 314 transitions from logic low to logic high, the first inverter 310 of the secondary latch 303 is enabled based on the latch enable bar signal LATB 315 received at its first enable terminal and the latch enable signal LAT 314 received at its second enable terminal. The first inverter 310 receives the logic high secondary latch input signal 318 and generates a logic low boost signal 316, which is latched in the secondary latch 303 based on the second and third inverters (311, 312) of the secondary latch 303.

At time T=2, as shown in FIG. 4, bit data containing a logic level of "1" is read from a memory cell 218. The read global bit line signal 107 is at logic low ("0") and the boost signal 316 is also at logic low ("0"). At the start of a clock cycle, the clock signal CLK 202 may transition from logic low ("0") to logic high ("1"). As discussed above, the clock signal CLK 202 transitions from logic low ("0") to logic high ("1") based on oscillation of an oscillator within the memory device 100. Based on the transition of the clock signal CLK 202 from logic low ("0") to logic high ("1"), the internal clock signal INT CLK 201 may also transition from logic low ("0") to logic high ("1"). As discussed above, the transition of the internal clock signal INT CLK 201 may be based on the oscillation of an RC oscillator within the memory device 100. The internal clock signal INT CLK 201 may be generated in the control block of the memory device 100. Based on the rising edge of the internal clock signal INT CLK 201, the sense amplifier pre-charge signal SAPREB 208 transitions from logic low ("0") to logic high ("1"). For example, the control block of the memory device 100 may transition the sense amplifier pre-charge signal SAPREB 208 from logic low ("0") to logic high ("1") based on the control block detecting the rising edge of the internal clock signal INT CLK 201. The sense amplifier pre-charge signal SAPREB charges both the read bit line signal RBL 207 and the read bit line bar signal RBLB 206 to logic high ("1"). The internal clock signal INT CLK 201 may then transition from logic high ("1") to logic low ("0") based on the oscillation of the RC oscillator within the memory device 100.

Based on the falling edge (e.g., the transition from logic high to logic low) of the internal clock signal INT CLK 201, the sense amplifier enable signal SAE 209 transitions from logic low to logic high. As discussed above, the control block may sense the falling edge of the internal clock signal INT CLK 201 and switch the sense amplifier enable signal SAE 209 from logic low to logic high. Furthermore, based on the falling edge of the internal clock signal INT CLK 201, the latch enable signal LAT 314 transitions from logic high to logic low. For example, the control block in the memory device 100 senses the falling edge of the internal clock signal INT CLK 201 and switches the latch enable signal LAT 314 from logic high to logic low. Based on the logic high sense amplifier enable signal SAE 209, the read bit line signal RBL 207 remains at logic high ("1"). For example, the sense amplifier enable signal SAE 209 can maintain the read bit line signal RBL 207 at the logic high level based on the logic high bit data read from the memory cell 218. Furthermore, the read bit line bar signal RBLB 206 transitions from logic high ("1") to logic low ("0"). As discussed above with reference to FIG. 2, the read bit line bar signal RBLB 206 is received at the PMOS transistor 211 of the LIO circuit 102. The PMOS transistor 211 couples the global bit line 213 to the VDD voltage level 221, and the global bit line signal RGBL 107 transitions from logic low to logic high.

The first inverter 307 of the global bit line bar signal latch 302 receives the logic low global bit line bar signal RGBLB 320 and generates a logic high global bit line latch signal RGBL_LAT 319. The second inverter 308 of the global bit line bar signal latch 302 is disabled based on the logic high latch enable bar signal LATB 315 received at its first enable terminal and the logic low latch enable signal LAT 314 received at its second enable terminal. Thus, the global bit line bar signal RGBLB 320 is maintained at logic high. The secondary latch input inverter 309 receives the logic high global bit line latch signal RGBL_LAT 319 and generates a logic low secondary latch input signal 318. The logic low secondary latch input signal 318 is received by the first inverter 310 of the secondary latch 303. The first inverter 310 of the secondary latch 303 is disabled based on the logic high latch enable bar signal LATB 315 received its first enable terminal and the logic low latch enable signal LAT 314 received at its second enable terminal. Therefore, the boost signal 316 at the booster node 317 is maintained at logic low from the previous clock cycle.

The first inverter 307 of the global bit line bar signal latch 302 receives the logic low global bit line bar signal RGBLB 320 and generates a logic high global bit line latch signal RGBL_LAT 319. The second inverter 308 of the global bit line bar signal latch 302 is disabled based on the logic high latch enable bar signal LATB 315 received at its first enable terminal and the logic low latch enable signal LAT 314 received at its second enable terminal. Thus, the global bit line bar signal RGBLB 320 is maintained at logic high. The secondary latch input inverter 309 receives the logic high global bit line latch signal RGBL_LAT 319 and generates a logic low secondary latch input signal 318. The logic low secondary latch input signal 318 is received by the first inverter 310 of the secondary latch 303. The first inverter 310 of the secondary latch 303 is disabled based on the logic high latch enable bar signal LATB 315 received its first enable terminal and the logic low latch enable signal LAT 314 received at its second enable terminal. Therefore, the boost signal 316 at the booster node 317 is maintained at logic low from the previous clock cycle.

As discussed above, the booster node 317 is coupled to the first enable terminal and the second enable terminal of the booster inverter 313 of the booster circuit 105. The booster inverter 313 is enabled based on the boost signal 316 received at its first and second enable terminals. Thus, the logic low global bit line bar signal RGBLB 320 is received at the input of the booster inverter 313 and the booster inverter 313 outputs a logic high booster inverter output signal 321. As discussed above, the output of the booster inverter 313 is coupled to the global bit line 213. The logic high booster inverter output signal 321 and the boost signal 316 can thus drive the global bit line 213 and latch the logic high global bit line signal RGBL 107 based on the previously read data stored in the secondary latch 303 (e.g., the boost signal 316). When the latch enable signal LAT 314 transitions from logic low to logic high, the first inverter 310 of the secondary latch 303 is enabled based on the latch enable bar signal LATB 315 received at its first enable terminal and the latch enable signal LAT 314 received at its second enable terminal. The first inverter 310 receives the logic low secondary latch input signal 318 and generates a logic high boost signal 316, which is latched in the secondary latch 303 based on the second and third inverters (311, 312) of the secondary latch 303.

The systems and methods described above can improve the slope of the logic levels of the global bit line signal RGBL 107 by driving the global bit line signal RGBL 107 with components within the GIO circuit 103. Furthermore, the disclosed systems and methods can eliminate or mitigate the dependency of latching the global bit line signal RGBL 107 on the sense amplifier enable signal SAE 209 being enabled. The global bit line signal RGBL 107 may be latched in the GIO circuit 103 based on signals stored in the GIO circuit 103. Therefore, the pulse width (e.g., the time at logic high) of the sense amplifier enable signal SAE 209 may be decreased, and the pre-charging of the read bit line signal RBL 207 and the read bit line bar signal RBLB 206 may occur sooner than if latching the global bit line signal RGBL 107 depended entirely on the sense amplifier enable signal SAE 209 driving the global bit line signal RGBL 107 to a sufficient logic level. This can lead to decreased access time of bit data from the memory cell array 101 and decreased read cycle times.

Figure 5:
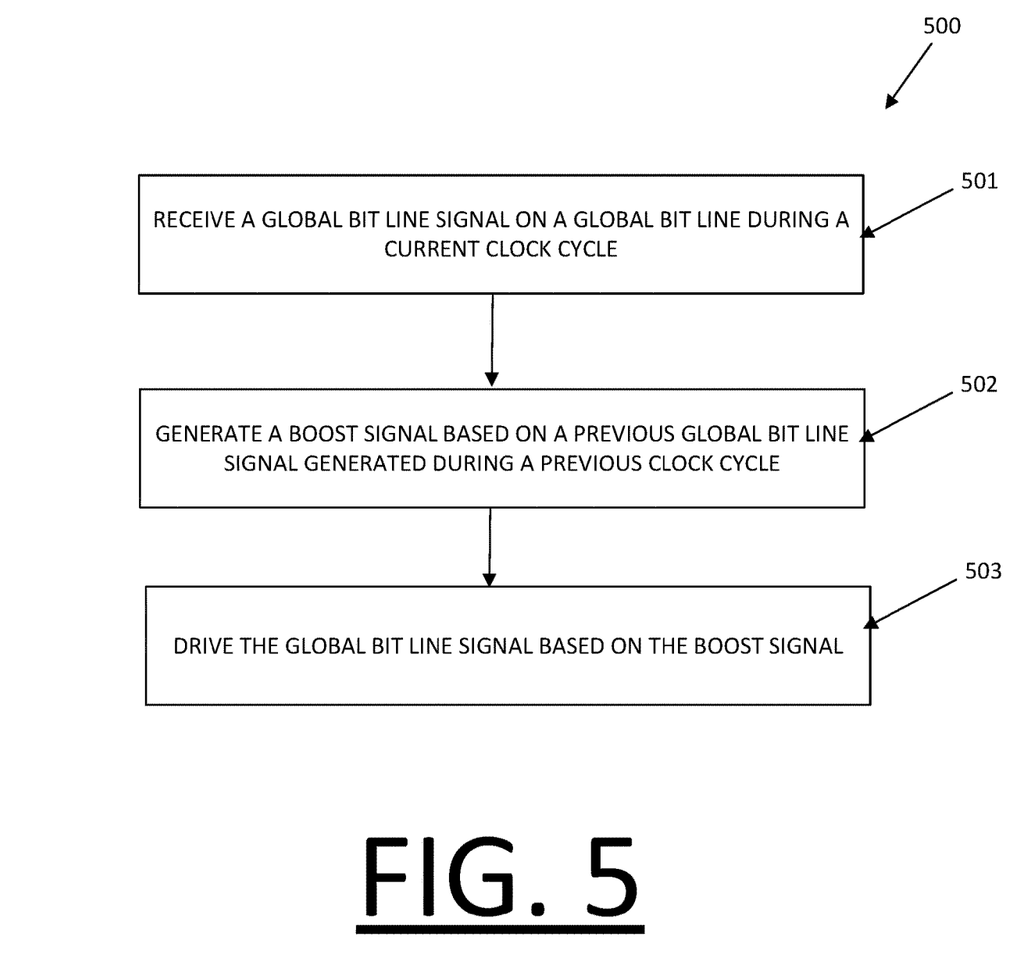
FIG. 5 depicts a method, in accordance with some embodiments.

FIG. 5 depicts a method, in accordance with some embodiments. In the example embodiment depicted in FIG. 5, the method 500 includes a first step 501 of receiving a global bit line signal on a global bit line during a current clock cycle. The first step 501 is depicted in FIG. 2. The GIO circuit 103 receives the global bit line signal 107 on the global bit line 213. A second step 502 in the method 500 is generating a boost signal based on a previous global bit line signal generated during a previous clock cycle. The second step 502 is shown in FIG. 3. The boost signal 316 is generated in the secondary latch 303 based on a previous global bit line signal generated during a previous clock cycle, as described further above with respect to FIG. 3. A third step 503 in the method 500 is driving the global bit line signal based on the boost signal. The third step 503 is shown in FIG. 3. The boost signal 316 is received by the booster inverter 313. The booster inverter 313 drives the global bit line signal 107 on the global bit line 213.

Systems and methods are disclosed herein. In one example, a memory device includes a first memory array, a local input/output (LIO) circuit, and a global input/output (GIO) circuit. The first memory array includes a memory cell and a local bit line. The LIO circuit is coupled to the local bit line and is configured to receive a local bit line signal on the local bit line and to generate a global bit line signal on a global bit line based on the local bit line signal. The GIO circuit is coupled to the LIO circuit and is configured to receive the global bit line signal. The GIO circuit comprises a latch circuit including a global bit line signal latch that is configured to latch the global bit line signal. The GIO circuit further includes a booster circuit coupled to the global bit line signal latch that is configured to drive the global bit line signal in the GIO circuit based on a previous global bit line signal generated at a previous clock cycle.

In another example, a global input/output (GIO) circuit is configured to receive a global bit line signal on a global bit line. The GIO circuit comprises a global bit line signal latch coupled to the global bit line. The global bit line signal latch is configured to latch the global bit line signal. The GIO circuit further comprises a global bit line bar signal latch is coupled to the global bit line signal latch. The global bit line bar signal latch is configured to latch a global bit line bar signal. The GIO circuit further comprises a booster circuit coupled to the global bit line. The booster circuit is configured to receive a boost signal and to drive the global bit line signal in the GIO circuit based on the boost signal.

In another example, a method includes receiving a global bit line signal on a global bit line during a current clock cycle. The method further includes generating a boost signal based on a previous global bit line signal generated during a previous clock cycle. The method further includes driving the global bit line signal based on the boost signal.

It will be appreciated by those skilled in the art that changes could be made to the embodiments described above without departing from the broad inventive concept thereof. It is understood, therefore, that the invention disclosed herein is not limited to the particular embodiments disclosed, and is intended to cover modifications within the spirit and scope of the present invention.

What is claimed is:

1. A memory device comprising:
    a first memory array including a memory cell and a local bit line;
    a local input/output (LIO) circuit coupled to the local bit line, the LIO circuit configured to receive a local bit line signal on the local bit line and to generate a global bit line signal on a global bit line based on the local bit line signal; and
    a global input/output (GIO) circuit coupled to the LIO circuit, the GIO circuit configured to receive the global bit line signal, the GIO circuit comprising:
        a latch circuit including a global bit line signal latch, the global bit line signal latch configured to receive and latch the global bit line signal; and
        a booster circuit coupled to the global bit line signal latch, an output of the booster circuit configured to drive the global bit line signal in the GIO circuit based on a previous global bit line signal generated at a previous clock cycle.

2. The memory device of claim 1, the latch circuit further comprising a secondary latch including a booster node, the booster node configured to latch a boost signal based on the previous global bit line signal.

3. The memory device of claim 2, wherein the booster circuit is further coupled to the secondary latch, wherein the booster circuit comprises a booster inverter configured to receive a global bit line bar signal and the boost signal, the global bit line bar signal being an inverse of the global bit line signal.

4. The memory device of claim 3, wherein the booster inverter is enabled based on the boost signal.

5. The memory device of claim 1, wherein the latch circuit further comprises a global bit line bar signal latch configured to latch a global bit line bar signal, the global bit line bar signal being an inverse of the global bit line signal.

6. The memory device of claim 1, wherein the global bit line signal latch comprises a plurality of inverters, wherein one or more of the plurality of inverters receives a latch enable signal and is enabled or disabled based on the latch enable signal.

7. The memory device of claim 6, further comprising a global control block coupled to the GIO circuit, the global control block configured to generate the latch enable signal.

8. The memory device of claim 1, wherein the memory device is a static random-access memory (SRAM) device.

9. The memory device of claim 1, wherein the LIO circuit is configured to generate a read bit line signal, wherein the global bit line signal is generated based on the read bit line signal.

10. The memory device of claim 9, wherein the LIO circuit further comprises a sense amplifier configured to charge the read bit line signal to a sufficient logic level.

11. A global input/output (GIO) circuit configured to receive a global bit line signal on a global bit line, the GIO circuit comprising:
    a global bit line signal latch coupled to the global bit line, the global bit line signal latch configured to latch the global bit line signal;
    a global bit line bar signal latch coupled to the global bit line signal latch, the global bit line bar signal latch configured to latch a global bit line bar signal, the global bit line bar signal being an inverse of the global bit line signal; and
    a booster circuit coupled to the global bit line, the booster circuit configured to receive a boost signal and the global bit line bar signal and drive the global bit line signal in the GIO circuit based on the boost signal.

12. The GIO circuit of claim 11, further comprising a secondary latch coupled to the global bit line bar signal latch, the secondary latch configured to generate the boost signal based on a previous global bit line signal from a previous clock cycle.

13. The GIO circuit of claim 11, wherein the booster circuit comprises a boosting inverter, the boosting inverter being enabled or disabled based on the boost signal.

14. The GIO circuit of claim 11, wherein the global bit line signal latch comprises a plurality of inverters, wherein one or more of the plurality of inverters is configured to receive a latch enable signal and is enabled or disabled based on the latch enable signal.

15. A method comprising:
    receiving a global bit line signal on a global bit line during a current clock cycle;
    generating a global bit line bar signal being an inverse of the global bit line signal;
    generating a boost signal based on a previous global bit line signal generated during a previous clock cycle; and
    driving the global bit line signal based on the boost signal and the global bit line bar signal.

16. The method of claim 15 further comprising receiving the boost signal at a booster circuit including a booster inverter, the booster inverter configured to drive the global bit line signal.

17. The method of claim 15, further comprising latching the global bit line signal in a global bit line signal latch.

18. The method of claim 15, further comprising latching the global bit line bar signal in a global bit line bar signal latch.

19. The method of claim 15, wherein the boost signal is generated at a secondary latch comprising a plurality of inverters.

20. The method of claim 19, wherein one or more of the plurality of inverters is a first inverter, the first inverter being enabled or disabled based on receiving a latch enable signal.

\* \* \* \* \*